US011075140B2

United States Patent
Bessho et al.

(10) Patent No.: US 11,075,140 B2
(45) Date of Patent: Jul. 27, 2021

(54) HEAT CONDUCTION STRUCTURE OR SEMICONDUCTOR APPARATUS

(71) Applicants: Takeshi Bessho, Toyota (JP); Masataka Deguchi, Nagoya (JP); Nagahiro Saito, Nagoya (JP); Kazuo Hashimi, Nagoya (JP)

(72) Inventors: Takeshi Bessho, Toyota (JP); Masataka Deguchi, Nagoya (JP); Nagahiro Saito, Nagoya (JP); Kazuo Hashimi, Nagoya (JP)

(73) Assignees: TOYOTA JIDOSHA KABUSHIKI KAISHA, Toyota (JP); NATIONAL UNIVERSITY CORPORATION NAGOYA UNIVERSITY, Nagoya (JP)

( * ) Notice: Subject to any disclaimer, the term of this patent is extended or adjusted under 35 U.S.C. 154(b) by 0 days.

(21) Appl. No.: 16/449,999

(22) Filed: Jun. 24, 2019

(65) Prior Publication Data
US 2020/0006195 A1    Jan. 2, 2020

(30) Foreign Application Priority Data
Jun. 28, 2018    (JP) .............................. JP2018-122617

(51) Int. Cl.
*H01L 23/34*    (2006.01)
*H01L 23/42*    (2006.01)

(52) U.S. Cl.
CPC .................... *H01L 23/42* (2013.01)

(58) Field of Classification Search
CPC ............................ H01L 23/34; H01L 23/42
USPC ................................................. 257/712, 713
See application file for complete search history.

(56) References Cited

U.S. PATENT DOCUMENTS

| 6,597,575 B1* | 7/2003 | Matayabas, Jr. ..... H01L 23/3737 165/185 |
| 7,038,311 B2* | 5/2006 | Woodall .............. H01L 23/3677 257/706 |
| 2005/0231855 A1* | 10/2005 | Tran ........................ G11C 11/21 360/324.1 |
| 2006/0066434 A1* | 3/2006 | Richards ................ B82Y 30/00 337/14 |

(Continued)

FOREIGN PATENT DOCUMENTS

| DE | 102007027469 A1 | 12/2008 |
| JP | 2016-162929 A | 9/2016 |

OTHER PUBLICATIONS

Effects of chemical bonding on heat transport across interfaces (Mark D. Losego et al., Nature Materials, vol. 11, Jun. 2012).

(Continued)

*Primary Examiner* — Nitin Parekh
(74) *Attorney, Agent, or Firm* — Sughrue Mion, PLLC

(57) ABSTRACT

The disclosure provides a heat conduction structure with higher heat conductivity. This embodiment is a heat conduction structure where heat is conducted from a first member to a second member. The heat conduction structure includes at least one self-assembled monolayer and a heat dissipation grease. The self-assembled monolayer is formed on at least one surface of the first member and the second member. The heat dissipation grease is disposed between the first member and the second member. The heat dissipation grease is in contact with the self-assembled monolayer.

9 Claims, 5 Drawing Sheets

(56) References Cited

U.S. PATENT DOCUMENTS

| | | | | |
|---|---|---|---|---|
| 2010/0304101 | A1* | 12/2010 | Lin | B82Y 30/00 |
| | | | | 428/212 |
| 2015/0226497 | A1* | 8/2015 | Wang | F28D 15/0233 |
| | | | | 165/104.28 |
| 2016/0365699 | A1* | 12/2016 | Lell | H01S 5/0282 |
| 2017/0092561 | A1* | 3/2017 | Eid | H01L 23/3675 |
| 2017/0343017 | A1* | 11/2017 | Polston | E03F 9/00 |
| 2017/0349801 | A1* | 12/2017 | Wu | C09K 5/14 |
| 2019/0249007 | A1* | 8/2019 | Shen | C08L 83/04 |
| 2019/0343017 | A1* | 11/2019 | Eid | H01L 23/367 |

OTHER PUBLICATIONS

Fangyuan Sun et al., "Molecular Bridge Enables Anomalous Enhancement in Thermal Transport across Hard-Soft Material Interfaces", Advanced Materials, 2014, 26, pp. 6093-6099 (7 pages total).

Yanlian Lei et al., "Engineering gate dielectric surface properties for enhanced polymer field-effect transistor performance", Journal of Materials Chemistry C, 2015, 3, pp. 12267-12272 (7 pages total).

* cited by examiner

HEAT CONDUCTION STRUCTURE OR SEMICONDUCTOR APPARATUS

CROSS REFERENCE TO RELATED APPLICATIONS

The present application claims priority from Japanese patent application JP 2018-122617 filed on Jun. 28, 2018, the content of which is hereby incorporated by reference into this application.

BACKGROUND

Technical Field

The disclosure relates to a heat conduction structure or a semiconductor apparatus.

Background Art

Some members used in electronic devices of an automobile and an electrical product generate heat during the use like a power module for power supply control, such as an inverter or a CPU of a computer. To avoid functional failure of the electronic device caused by the heat and maintain its performance, the generated heat should be promptly discharged outside the electronic device. Therefore, the electronic device usually internally includes a heat dissipation member, such as a heat sink. Usually, between a heat generating member and the heat dissipation member, a heat dissipation grease is provided to efficiently conduct the heat generated by the heat generating member to the heat dissipation member, thus accelerating heat dissipation.

Conventionally, generally used heat dissipation grease is a semisolid grease where, for example, a highly heat conductive fine powder filler, which contains a metal oxide, such as zinc oxide or aluminum oxide and an inorganic nitride, such as boron nitride, silicon nitride, or aluminum nitride, is dispersed in a synthetic hydrocarbon oil and the like, such as a silicone oil or a polyolefin oil. However, rapid performance improvement of electronic equipment and rapid progress of compact and high-density implementation causes rapid increase in heat generation amount of the electronic equipment. Therefore, various kinds of development have been made from the aspect of heat control in the electronic equipment.

For example, JP 2016-162929 A discloses a heat dissipation grease interposed between adhered bodies and used under pressure. The heat dissipation grease contains a silicon-based oil and a heat conduction filler dispersed in the silicon-based oil. The heat conduction filler has Mohs hardness of 4 or less and heat conductivity of 80 W/mK or more.

Effects of chemical bonding on heat transport across interfaces (Mark D. Losego et al., NATURE MATERIALS, Vol 11, June 2012) describes a study on heat conduction between a Qz substrate and an Au substrate where a bifunctional Self-Assembled monolayer (SAM) coupled to both substrates is used to improve the heat conduction.

SUMMARY

As disclosed in JP 2016-162929 A and the like, while the heat dissipation grease having the improved heat conductivity is proposed, a technique that can provide higher heat conductivity is required. In the study disclosed in Effects of chemical bonding on heat transport across interfaces (Mark D. Losego et al., NATURE MATERIALS, Vol 11, June 2012), while the study is carried out with an ideal interface (flat surface without unevenness) as a model, since an actually used member has unevenness, the technique disclosed in Effects of chemical bonding on heat transport across interfaces (Mark D. Losego et al., NATURE MATERIALS, Vol 11, June 2012) is not practical.

Accordingly, the present disclosure provides a heat conduction structure excellent in heat conductivity.

Therefore, the inventors seriously examined and found that disposing the heat dissipation grease on a self-assembled monolayer formed on the surface of the member ensured further improved heat conductivity, and reached this embodiment.

Therefore, the exemplary aspects of this embodiment are as follows.

(1) A heat conduction structure where heat is conducted from a first member to a second member. The heat conduction structure includes at least one self-assembled monolayer and a heat dissipation grease. The at least one self-assembled monolayer is formed on at least one surface of the first member and the second member. The heat dissipation grease is disposed between the first member and the second member. The heat dissipation grease is in contact with the at least one self-assembled monolayer.

(2) In the heat conduction structure according to (1), the self-assembled monolayer is formed of a SAM-forming material that has a head group, and the head group forms a covalent bond with the surface of the first member or the second member.

(3) In the heat conduction structure according to (2), the head group forms a covalent bond with a functional group that exists on the surface of the first member or the second member.

(4) In the heat conduction structure according to (2) or (3), the SAM-forming material has a tail group in addition to the head group, and the tail group has hydrophobicity.

(5) In the heat conduction structure according to (4), the at least one self-assembled monolayer has a water contact angle of 70° or more.

(6) In the heat conduction structure according to any one of (1) to (5), the SAM-forming material is an organic silane compound.

(7) In the heat conduction structure according to any one of (1) to (6), the heat dissipation grease contains a mineral oil, an ester-based synthetic oil, a synthetic hydrocarbon oil, a silicone oil, or a fluorinated oil as a base oil.

(8) In the heat conduction structure according to any one of (1) to (7), the first member is a heat generating member, and the second member is a heat dissipation member.

(9) A semiconductor apparatus that includes the heat conduction structure according to any one of (1) to (8). The first member is a semiconductor module.

The disclosure can provide the heat conduction structure excellent in heat conductivity.

DETAILED DESCRIPTION

Figure 1A:
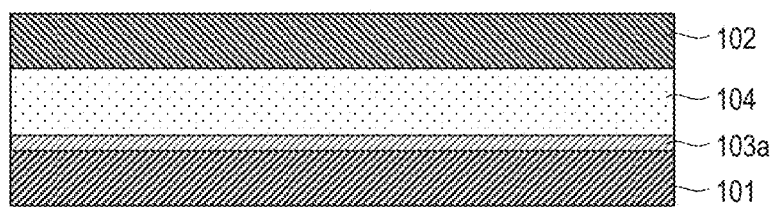
FIG. 1A is a schematic cross-sectional view illustrating an exemplary configuration of a heat conduction structure according to this embodiment.

One aspect of this embodiment is a heat conduction structure where heat is conducted from a first member to a second member. The heat conduction structure includes at least one self-assembled monolayer formed on at least one surface of the first member and the second member, and a heat dissipation grease disposed between the first member and the second member. The heat dissipation grease is in contact with the at least one self-assembled monolayer. In this embodiment, the at least one self-assembled monolayer is formed on the at least one surface of the first member and the second member, and the heat dissipation grease is disposed between the first member and the second member so as to contact the self-assembled monolayer. The configuration of this embodiment ensures improved heat conduction between the first member and the second member.

The following describes each component of the heat conduction structure according to this embodiment.

1. Heat Conduction Structure (First Member and Second Member)

In the heat conduction structure according to this embodiment, the heat is conducted from the first member to the second member. The first member and the second member are not specifically limited, and only necessary to be members relating to heat conduction. The first member is a member on the upstream side with respect to the second member in the heat flow, while the second member is a member on the downstream side. The first member is, for example, a heat generating member, while the second member is, for example, an emission member that receives the heat from the heat generating member to emit the heat from the heat generating member. In this Description, the "heat generating member" means a member that generates heat by energization and the like. In this embodiment, especially, a member that generates too much heat to be sufficiently cooled by heat dissipation due to natural convection is an object of the heat generating member. The heat generating member includes, for example, a semiconductor module, such as a power card and a CPU. In this Description, the "heat dissipation member" is a member that receives the heat generated by the heat generating member, such as the semiconductor module, and a member that contributes to the heat dissipation from the heat generating member. The heat dissipation member may be a member directly contributing to the heat dissipation, or a member indirectly contributing to the heat dissipation. For example, the heat dissipation member itself may be a cooling member, such as a heat sink, or the heat dissipation member may be a member that transfers the heat to the cooling member (such as a heat sink) disposed on the downstream side in the heat flow. The heat dissipation member is not necessary to be a member exclusive for the heat dissipation insofar as the heat dissipation member contributes to receiving the heat from the heat generating member and dissipating the heat outside. For example, an insulating material and a housing may be used as the heat dissipation member.

A material constituting the surface of the first member or the second member is not specifically limited. For example, when the self-assembled monolayer is formed on only the first member, it is only necessary that the material constituting the surface of the first member is the material on which the self-assembled monolayer can be formed, and when the self-assembled monolayer is formed on only the second member, it is only necessary that the material constituting the surface of the second member is the material on which the self-assembled monolayer can be formed. The material constituting the surface of the first member or the second member includes, for example, a metal (such as copper, aluminum, germanium, and the like) or a polymer material. In addition, for example, silicon (Si), glass, ceramic (such as alumina, silica, silicon carbide, and the like), or a carbon material (such as graphite, diamond, and the like) is included. The surface of the first member or the second member may be formed of a single material, or may be formed of a plurality of materials. The polymer material includes, for example, a thermoplastic resin or a thermosetting resin, and specifically includes, for example, an acrylic resin, such as polymethyl methacrylate, an epoxy resin, a polyamide resin, an aramid resin (aromatic polyamide and the like), a polyimide resin, an ABS resin, a polyethylene resin, a polypropylene resin, a polystyrene resin, a polycarbonate resin, a polyethylene terephthalate (PET) resin, a phenolic resin, an urea resin, or a melamine resin.

In some embodiments, a functional group exists on the surface of the first member or the second member. A SAM-forming material, which forms the self-assembled monolayer, can be coupled to the functional group. Such a functional group can be appropriately formed with an ultraviolet ray treatment and the like.

(Self-Assembled Monolayer)

In this Description, the "self-assembled monolayer (SAM)" means a monomolecular film (film of single molecular layer) where single molecules of a self-assembled monolayer forming material (SAM-forming material) as a raw material collects on the member surface and autonomously assembles. However, even if a part of the consequently obtained film does not form the monomolecular film against the intention (unintentionally) (for example, in the case where a plurality of layers of bilayer or more are formed), the obtained film is included in the technical scope of the disclosure insofar as the film is formed at least with the intention to mainly form the SAM.

In this description, the "self-assembled monolayer forming material (SAM-forming material)" means a material that can form the self-assembled monolayer on the member surface. In some embodiments, the SAM-forming material has at least one reactive group (head group) capable of forming a covalent bond with the member surface. "Capable of forming a covalent bond with the member surface" includes not only the case where the head group forms the covalent bond with elements constituting the member but also the case where the head group forms the covalent bond with a functional group existing on the member surface. The covalent bond of the self-assembled monolayer with the member surface ensures improved heat conduction between the self-assembled monolayer and the member via phonons.

The head group is not specifically limited insofar as the head group is a functional group capable of forming the covalent bond with the member surface. The head group includes, for example, an alkoxysilyl group, a halogenated silyl group, a cyano group, a thiol group, a carboxyl group, and a bromine or phosphonic acid group. The carbon number of an alkoxy group in the alkoxysilyl group is, for example, one to four, and one to three in some embodiments. As a specific example, the alkoxy group includes a methoxy group (methoxysilyl group) or an ethoxy group (ethoxysilyl group). The halogen atom in the halogenated silyl group includes, for example, fluorine (F), chlorine (Cl), bromine (Br), and iodine (I). In some embodiments, the halogen atom is Cl or Br among those atoms. The SAM-forming material may have one head group or may have a plurality of (for example, two or three) head groups. In the SAM-forming material having the plurality of head groups, the plurality of head groups may be identical, or may be mutually different. In some embodiments, a compound having a plurality of identical head groups is usually employed.

In some embodiments, the SAM-forming material has at least one tail group extending in a direction opposite to the head group (direction opposite to the member side) in addition to the head group. While the tail group is not specifically limited, from the aspect of suitability with the heat dissipation grease, the tail group has hydrophobicity (lipophilic property) in some embodiments. The tail group having the hydrophobicity further decreases heat conduction resistance between the self-assembled monolayer and the heat dissipation grease. This is thought to be because the tail group enters into the heat dissipation grease to efficiently cause the heat conduction by the phonons. This is also thought to be because the hydrophobicity of the tail group can effectively attract the heat dissipation grease to the self-assembled monolayer, and this ensures restricting air bubbles containing water content and the like from being involved on the self-assembled monolayer when the heat dissipation grease is disposed. These presumptions do not limit this embodiment. The hydrophobicity of the tail group enhances the effect to hold the heat dissipation grease on the member surface, and causes the heat dissipation grease hardly to come off (desorption). In some embodiments, the self-assembled monolayer formed of the SAM-forming material having the tail group with the hydrophobicity has a water contact angle of 70° or more, 75° or more in some embodiments, and 80° or more in some embodiments. The tail group with the hydrophobicity includes, for example, a substituted or unsubstituted aliphatic group or a substituted or unsubstituted aromatic group. The carbon number of the aliphatic group is, for example, 1 to 30, 3 to 28 in some embodiments, and 5 to 26 in some embodiments. The aliphatic group may be a saturated aliphatic group, or may be an unsaturated aliphatic group. The aliphatic group may have a straight-chain shape, may have a branched-chain shape, or may have a ring shape. The aliphatic group may form a ring (for example, a cyclo ring (cyclohexyl ring and the like)) where at least a part is nonaromatic. The carbon number of the aromatic group is, for example, 5 to 30, and 6 to 28 in some embodiments. A part of the carbon atoms constituting the aliphatic group (for example, carbon atoms constituting a main chain of the aliphatic group) may be substituted for heteroatoms (such as nitrogen atoms, oxygen atoms, sulfur atoms, or the like). A part of the carbon atoms constituting the aromatic group (for example, carbon atoms constituting the aromatic ring) may be substituted for the heteroatoms (such as nitrogen atoms, oxygen atoms, sulfur atoms, or the like). The substituent includes, for example, a saturated or unsaturated hydrocarbon group having the carbon number of 1 to 12 (a methyl group, an ethyl group, and the like), an amino group (for example, mono or dialkylamino group, such as a dimethylamino group or the like), a halogen atom (for example, fluorine atom), and an epoxy group. The substituent is an alkyl group (for example, the carbon number of 1 to 4) in some embodiments.

An exemplary tail group includes the aliphatic group having the carbon number of 10 or more (typically 10 to 30) in some embodiments. The aliphatic group is the straight-chain aliphatic group having the carbon number of 10 to 30 (typically, a hydrocarbon group, such as an alkyl group, an alkenyl group, or an alkynyl group) in some embodiments. The aliphatic group is the straight-chain alkyl group having the carbon number of 10 to 30 in another embodiment. A specific example of the SAM-forming material having such a tail group includes n-octadecyltrimethoxysilane (ODS), n-octadecyltrichlorosilane, or the like.

The exemplary tail group includes a substituted or unsubstituted aromatic group (for example, benzene ring) in another embodiment. The carbon number of the aromatic group is 5 to 30 in some embodiments, and 6 to 20 in another embodiment. The tail group is, for example, a substituted or unsubstituted aryl group. The substituent can be exemplified by, for example, a saturated or unsaturated hydrocarbon group having the carbon number of 1 to 12 (such as a methyl group, an ethyl group, and the like), an amino group (for example, mono or dialkylamino group, such as a dimethylamino group or the like), a halogen atom (for example, fluorine atom and chlorine atom). A specific example of the SAM-forming material having such a tail group includes p-aminophenyltrichlorosilane, p-chloromethylphenyltrichlorosilane, or the like.

The exemplary tail group includes an aliphatic group having the epoxy group as the substituent in another embodiment. A part of the carbon atoms of the aliphatic group may be substituted for the oxygen atoms. The alkyl group (for example, the carbon number of 5 to 30) having the epoxy group as the substituent is employed in some embodiments, and a part of the carbon atoms of the alkyl group may be substituted for the oxygen atoms. A specific example of the SAM-forming material having such tail group includes, for example, 3-glycidyloxypropyltrimethoxysilane.

The SAM-forming material can include, for example, a compound with a structure where the above-described head group and tail group are bonded to a core atom, such as silicon (Si) or titanium (Ti). The SAM-forming material is a compound (organosilicon compound) containing silicon as the core atom in some embodiments. A specific example of the SAM-forming material includes an organic silane compound with a structure where at least one alkoxy group (for example, the methoxy group or the ethoxy group) and at least one tail group are coupled to the silicon atom as the core atom. More specifically, the SAM-forming material includes the compound (such as trimethoxysilane, triethoxysilane, or the like) with a structure where three alkoxy groups (for example, the methoxy group or the ethoxy group) and one tail group are coupled to the silicon atom as the core atom. For example, performing hydrolysis on the alkoxysilyl group obtains a silanol group (Si—OH) to allow forming the covalent bond with the functional group (for example, an OH group) that exists on the member surface.

In this embodiment, as the specific example, the SAM-forming material includes the compounds represented by the following formulas (I) to (V). The SAMs formed of these compounds have the high hydrophobicity (lipophilic property).

$$CH_3-(CH_2)_l-Si(OA)_3 \quad (I)$$

$$[CH_3-(CH_2)_l]_2-Si(OA)_2 \quad (II)$$

$$[CH_3-(CH_2)_l]_3-SiOA \quad (III)$$

$$CH_3-(CH_2)_m-COO-(CH_2)_n-Si(OA)_3 \quad (IV)$$

$$CH_3-(CH_2)_m-O-(CH_2)_n-Si(OA)_3 \quad (V)$$

In the formulas (I) to (V), "l" is an integer from 0 to 23, an integer from 1 to 21 in some embodiments, and an integer from 2 to 19 in some embodiments. "m" is an integer from 0 to 17, and an integer from 1 to 15 in some embodiments. "n" is an integer from 0 to 16, and an integer from 1 to 14 in some embodiments. A indicates the alkyl group having the carbon number of 1 to 4, and is the methyl group (methoxy group) or the ethyl group (ethoxy group) in some embodiments.

The organic silane compound having the hydrophobic group can include, for example, octadecyltriethoxysilane, octadecyltrimethoxysilane, octadecyltrichlorosilane, octadecylmethoxydichlorosilane, 3-butenyltriethoxysilane, 3-butenyltrimethoxysilane, 3-butenyltrichlorosilane, n-butyltriethoxysilane, n-butyltrimethoxysilane, n-butyltrichlorosilane, n-decyltriethoxysilane, n-decyltrimethoxysilane, n-decyltrichlorosilane, n-decylmethyldiethoxysilane, n-decylmethyldimethoxysilane, n-decylmethyldichlorosilane, diethyldiethoxysilane, diethyldimethoxysilane, diethyldichlorosilane, isooctadecyltriethoxysilane, isooctadecyltrimethoxysilane, isooctadecyltrichlorosilane, dihexyldiethoxysilane, dihexyldimethoxysilane, dihexyldichlorosilane, dioctyldiethoxysilane, dioctyldimethoxysilane, dioctyldichlorosilane, docosenyl triethoxysilane, docosenil trimethoxysilane, docosenil trichlorosilane, docosylmethyldiethoxysilane, docosylmethyldimethoxysilane, docosylmethyldichlorosilane, dodecylmethyldiethoxysilane, dodecylmethyldimethoxysilane, dodecylmethyldichlorosilane, dodecyltriethoxysilane, dodecyltrimethoxysilane, dodecyltrichlorosilane, eicosyltriethoxysilane, eicosyltrimethoxysilane, eicosyltrichlorosilane, ethyltriethoxysilane, ethyltrimethoxysilane, ethyltrichlorosilane, heptyltriethoxysilane, heptyltrimethoxysilane, heptyltrichlorosilane, hexadecyltriethoxysilane, hexadecyltrimethoxysilane, hexadecyltrichlorosilane, hexyltriethoxysilane, hexyltrimethoxysilane, hexyltrichlorosilane, isobutyltriethoxysilane, isobutyltrimethoxysilane, isobutyltrichlorosilane, 3-methoxypropyltriethoxysilane, 3-methoxypropyltrimethoxysilane, 3-methoxypropyltrichlorosilane, methyltriethoxysilane, methyltrimethoxysilane, methyltrichlorosilane, methyltripropoxysilane, methyltris(methoxyethoxy)silane, nonyltriethoxysilane, nonyltrimethoxysilane, nonyltrichlorosilane, octyltriethoxysilane, octyltrimethoxysilane, octyltrichlorosilane, pentyltriethoxysilane, pentyltrimethoxysilane, pentyltrichlorosilane, propyltriethoxysilane, propyltrimethoxysilane, propyltrichlorosilane, tetradecyltriethoxysilane, tetradecyltrimethoxysilane, tetradecyltrichlorosilane, undecyltriethoxysilane, undecyltrimethoxysilane, undecyltrichlorosilane, 7-octenyltriethoxysilane, 7-octenyltrimethoxysilane, and 7-octenyltrichlorosilane. Among these compounds, from the aspect of the ease of handling and safety, octadecyltriethoxysilane, octadecyltrimethoxysilane, isooctadecyltriethoxysilane, and isooctadecyltrimethoxysilane are employed in some embodiments.

A method for forming the SAM-forming material on the member surface is not specifically limited, but, for example, a gas phase method or a liquid phase method can be used. With the gas phase method, for example, the member surface is exposed to vapor containing the SAM-forming material (for example, an organic silane compound) for a certain period of time, and thus, the SAM can be formed. With the liquid phase method, for example, the member surface is immersed in a solution containing the SAM-forming material (for example, an organic silane compound) for a certain period of time, and thus, the SAM can be formed.

A pretreatment may be performed on the member before forming the SAM on the member surface. The pretreatment includes, for example, a treatment to introduce a hydroxyl group to the member surface. Use of the member where such a pretreatment has been performed ensures efficient formation of the high-quality (for example, highly oriented) SAM on the member surface. A method for introducing the hydroxyl group includes, for example, a method where the member surface is irradiated with a Vacuum Ultra Violet (hereinafter also referred to as the "VUV") under an atmosphere containing oxygen (typically, oxygen molecule ($O_2$)). For example, the member surface is irradiated with the VUV in a decompressed atmosphere (for example, about 1 Pa to 1500 Pa, and about 10 Pa to 1000 Pa in some embodiments), and thus the hydroxyl group can be introduced to the member surface. Thus, the member having the surface appropriate for forming the SAM may be prepared.

(Heat Dissipation Grease)

The heat dissipation grease is disposed between the first member and the second member while contacting the self-assembled monolayer.

The heat dissipation grease is not specifically limited. The heat dissipation grease means a grease having heat conductivity, and can be appropriately selected in consideration of heat dissipation performance and viscosity. The heat dissipation grease is a grease paste or a compound paste obtained by, for example, mixing a combination of a thickener and a heat conductive filler or the heat conductive filler having a thickening effect with the base oil. The base oil is not specifically limited, but various synthetic oils, such as a mineral oil, an ester-based synthetic oil, a synthetic hydrocarbon oil, a silicone oil, or a fluorinated oil can be used. Among them, the mineral oil, the synthetic hydrocarbon oil, or the silicone oil is used in some embodiments. The mineral oil, the synthetic hydrocarbon oil, and the silicone oil are excellent in heat resistance of the base oil from the aspect of long lubrication life of the grease.

A filling amount of the heat dissipation grease is not specifically limited, but can be appropriately determined according to a size and an area of a space between the first member (for example, the heat generating member) and the second member (for example, the heat dissipation member).

(Structure)

In the heat conduction structure according to this embodiment, the self-assembled monolayer is formed on the surface of at least one of the first member and the second member, and the heat dissipation grease is disposed between the first member and the second member while contacting the self-assembled monolayer. A description will be given of the specific configuration of the heat conduction structure according to this embodiment with reference to FIG. 1A to FIG. 1C.

FIG. 1A is a schematic cross-sectional view illustrating an exemplary configuration of the heat conduction structure according to this embodiment. In the heat conduction structure of the embodiment illustrated in FIG. 1A, a first self-assembled monolayer 103a is disposed on the surface of a first member 101, a heat dissipation grease 104 is disposed on the first self-assembled monolayer 103a, and a second member 102 is disposed on the heat dissipation grease 104. That is, in one embodiment, the first self-assembled monolayer 103a is disposed on the first member 101, and the heat dissipation grease 104 is disposed between the first self-assembled monolayer 103a and the second member 102. In this embodiment, the self-assembled monolayer is disposed only on the surface of the first member, and not disposed on the surface of the second member.

Figure 1B:
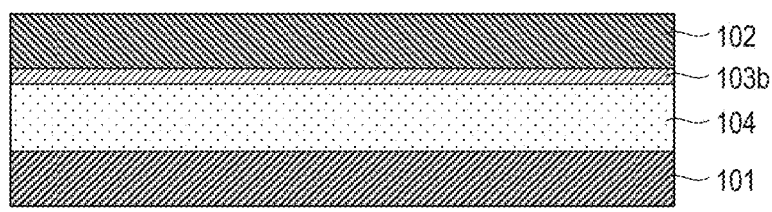
FIG. 1B is a schematic cross-sectional view illustrating an exemplary configuration of the heat conduction structure according to this embodiment.

FIG. 1B is a schematic cross-sectional view illustrating an exemplary configuration of the heat conduction structure according to this embodiment. In the heat conduction structure of the embodiment illustrated in FIG. 1B, the heat dissipation grease 104 is disposed on the surface of the first member 101, a second self-assembled monolayer 103b is disposed on the heat dissipation grease 104, and the second member 102 is disposed on the second self-assembled monolayer 103b. That is, in one embodiment, the second self-assembled monolayer 103b is disposed on the second member 102, and the heat dissipation grease 104 is disposed between the second self-assembled monolayer 103b and the first member 101. In this embodiment, the self-assembled monolayer is disposed only on the surface of the second member, and not disposed on the surface of the first member.

Figure 1C:
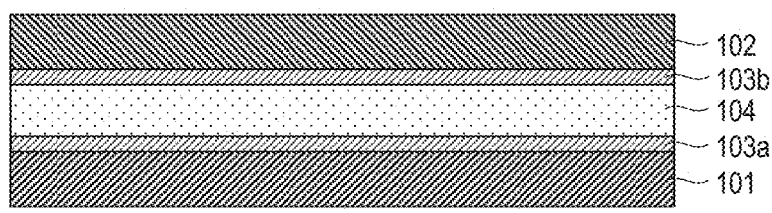
FIG. 1C is a schematic cross-sectional view illustrating an exemplary configuration of the heat conduction structure according to this embodiment.

FIG. 1C is a schematic cross-sectional view illustrating an exemplary configuration of the heat conduction structure according to this embodiment. In the heat conduction structure of the embodiment illustrated in FIG. 1C, the first self-assembled monolayer 103a is disposed on the surface of the first member 101, the heat dissipation grease 104 is disposed on the first self-assembled monolayer 103a, the second self-assembled monolayer 103b is disposed on the heat dissipation grease 104, and the second member 102 is disposed on the second self-assembled monolayer 103b. That is, in one embodiment, the first self-assembled monolayer 103a and the second self-assembled monolayer 103b are disposed on the first member 101 and the second member 102, respectively, and the heat dissipation grease 104 is disposed between the first self-assembled monolayer 103a and the second self-assembled monolayer 103b. In this embodiment, the self-assembled monolayer is disposed on each of the surface of the first member and the surface of the second member. The first self-assembled monolayer and the second self-assembled monolayer are mutually independent, and may be formed of an identical material or may be formed of different materials. Even when the heat dissipation grease is not disposed in the configurations of FIG. 1A to FIG. 1C, the heat conductivity is considered to be improved.

The configuration of this embodiment ensures the improved heat conductivity between the first member and the second member. As the reason for the improved heat conductivity, the following reasons are presumed. Since the self-assembled monolayer is regularly oriented on the member surface and chemically bonded to the member surface, the heat from the member can be efficiently received via the movement of the phonons. The self-assembled monolayer regularly oriented on the member surface can efficiently transfer the heat to the heat dissipation grease. Especially, as described above, when the self-assembled monolayer has the hydrophobic group, the hydrophobic group gets into the heat dissipation grease, and thus, the heat conduction is considered to efficiently occure. In the conventional method where the heat dissipation grease is simply disposed on the member surface, bubbles remain on the unevenness on the member in some cases. The bubbles remaining on the unevenness reduces the heat dissipation grease from contacting the member surface at that part, and thus the heat conduction decreases. Meanwhile, as this embodiment, the formation of the self-assembled monolayer on the member surface can restrict the bubbles of air and the like from being caught in the unevenness on the member surface. With the above-described reason, the heat conductivity between the first member and the second member is presumed to be improved. The presumption does not limit this embodiment.

2. Semiconductor Apparatus

Figure 2:
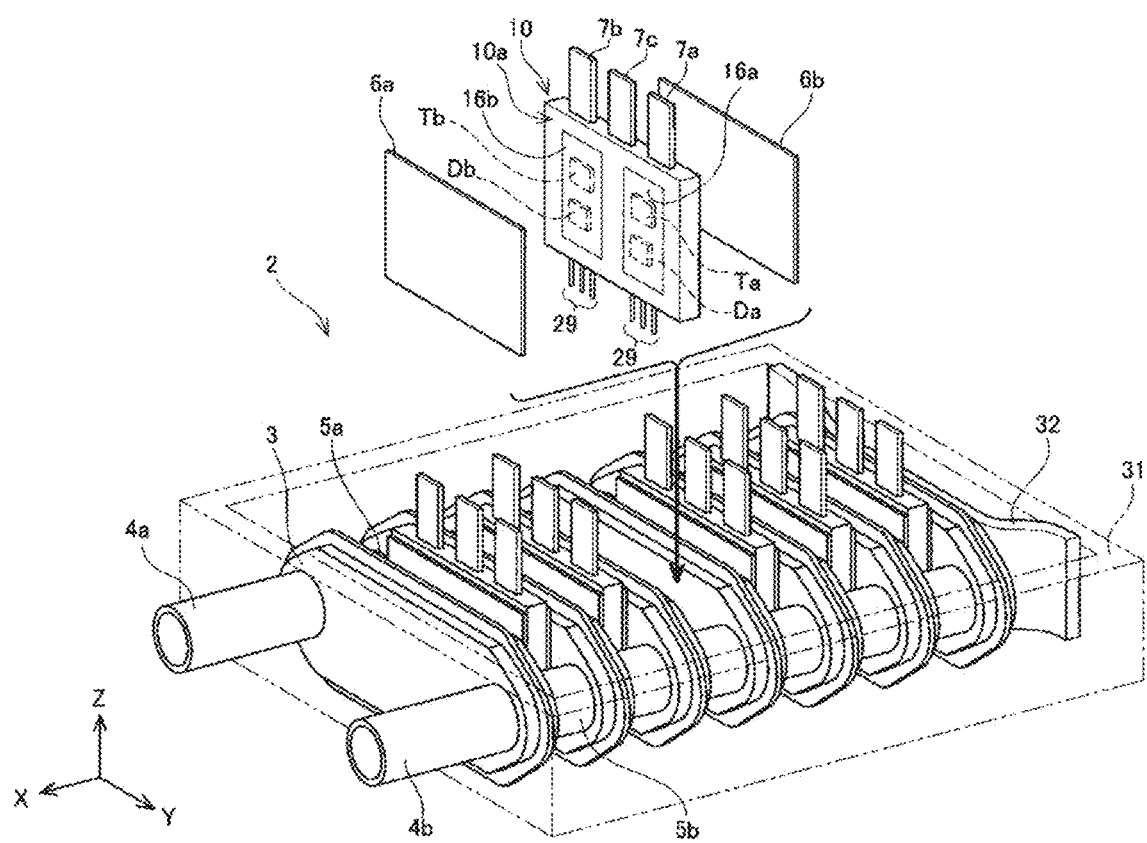
FIG. 2 is a schematic perspective view describing an exemplary configuration of a semiconductor apparatus according to this embodiment.

The following describes the exemplary configuration of the semiconductor apparatus according to this embodiment with reference to the drawings. FIG. 2 is a perspective view of a semiconductor apparatus 2. The semiconductor apparatus 2 is a unit where a plurality of power cards 10 and a plurality of coolers 3 are stacked. In FIG. 2, reference numeral 10 is attached to only one power card, and reference numerals to the other power cards are omitted. Similarly, in FIG. 2, reference numeral 3 is attached to only one cooler, and reference numerals to the other coolers are omitted. For viewing the whole semiconductor apparatus 2, a case 31, which houses the semiconductor apparatus 2, is illustrated by virtual lines. The one power card 10 is sandwiched between the two coolers 3. An insulating plate 6a is sandwiched between the power card 10 and one cooler 3, and an insulating plate 6b is sandwiched between the power card 10 and the other cooler 3. Greases 20a and 20b (see FIG. 3) are applied between the power card 10 and the insulating plates 6a and 6b. Greases 9a and 9b (see FIG. 3) are applied between the insulating plates 6a and 6b and the cooler 3. In FIG. 2, the illustrations of the greases are omitted. For easy understanding, FIG. 2 illustrates the one power card 10 and the insulating plates 6a and 6b extracted from the semiconductor apparatus 2.

The one the power card 10 houses four semiconductor devices. The four semiconductor devices are, specifically, two transistors Ta and Tb and two diodes Da and Db. The semiconductor devices are cooled by a refrigerant passing through the coolers 3. The refrigerant is a liquid, typically water.

Both the power card 10 and the cooler 3 are flat plate type, and stacked such that flat surfaces having maximum areas among a plurality of the side surfaces mutually face. The power cards 10 and the coolers 3 are alternately stacked, and the coolers 3 are positioned at both ends in a stacking direction of the unit. The plurality of coolers 3 are coupled by coupling pipes 5a and 5b. A refrigerant supply pipe 4a and a refrigerant discharge pipe 4b are coupled to the cooler 3 positioned at the one end in the stacking direction of the unit. The refrigerant supplied through the refrigerant supply pipe 4a is distributed to every cooler 3 through the coupling pipe 5a. The refrigerant absorbs the heat from the adjacent power card 10 while passing through each cooler 3. The refrigerant that has passed through each cooler 3 passes through the coupling pipe 5b and is discharged from the refrigerant discharge pipe 4b.

When the semiconductor apparatus 2 is housed in the case 31, a leaf spring 32 is inserted on the other end side in the stacking direction of the unit. The leaf spring 32 applies load from both sides in the stacking direction to the unit where the power cards 10, the insulating plates 6a and 6b, and the coolers 3 are stacked. The load is, for example, 1 to 10 [kN]. The greases 20a and 20b are applied between the insulating plates 6a and 6b, and the power card 10. The load application expands the layer of the grease to make it thin, thus enhancing the heat conduction efficiency from the power card 10 to the cooler 3. The power card 10 has flat surfaces 10a and 10b on which respective self-assembled monolayers (not illustrated) are formed. The formation of the self-assembled monolayer ensures the improved conduction of the heat generated in the power card 10 to the greases 20a and 20b. The insulating plates 6a and 6b directly deprive the power card 10 of the heat. Therefore, the insulating plates 6a and 6b serve as the heat dissipation members in this embodiment.

In the semiconductor apparatus 2, the self-assembled monolayer is formed on the surface of the power card 10 that houses the semiconductor devices (each device Ta, Tb, Da, and Db), and the greases 20a and 20b are disposed between the self-assembled monolayers and the insulating plates 6a and 6b. In the other embodiment, the self-assembled monolayers may be formed not on the flat surfaces 10a and 10b of the power card 10 but on the surfaces of the insulating plates 6a and 6b. In the other embodiment, the self-assembled monolayer may be formed also on the surfaces of the insulating plates 6a and 6b in addition to the flat surfaces 10a and 10b of the power card 10. In the other embodiment, the self-assembled monolayer may be formed on the surfaces of the insulating plates 6a and 6b and/or the surface of the cooler 3.

The power card 10 will be described. The power card 10 includes heat dissipation plates 16a and 16b exposed on the one flat surface 10a facing the insulating plate 6a. As described above, the self-assembled monolayer is formed on the flat surface 10a, and the grease 20a is disposed between the self-assembled monolayer and the insulating plate 6a. Another heat dissipation plate 17 (not illustrated in FIG. 2) is exposed on the flat surface 10b on the opposite side of the flat surface 10a. The self-assembled monolayer is formed on the flat surface 10b, and the grease 20b is disposed between the self-assembled monolayer and the insulating plate 6b. Three electrode terminals 7a, 7b, and 7c extend from a top surface (surface facing in a positive direction of a Z-axis in the drawing) of the power card 10, and control terminals 29 extend from a lower surface (surface facing in a negative direction of the Z-axis direction in the drawing).

Figure 3:
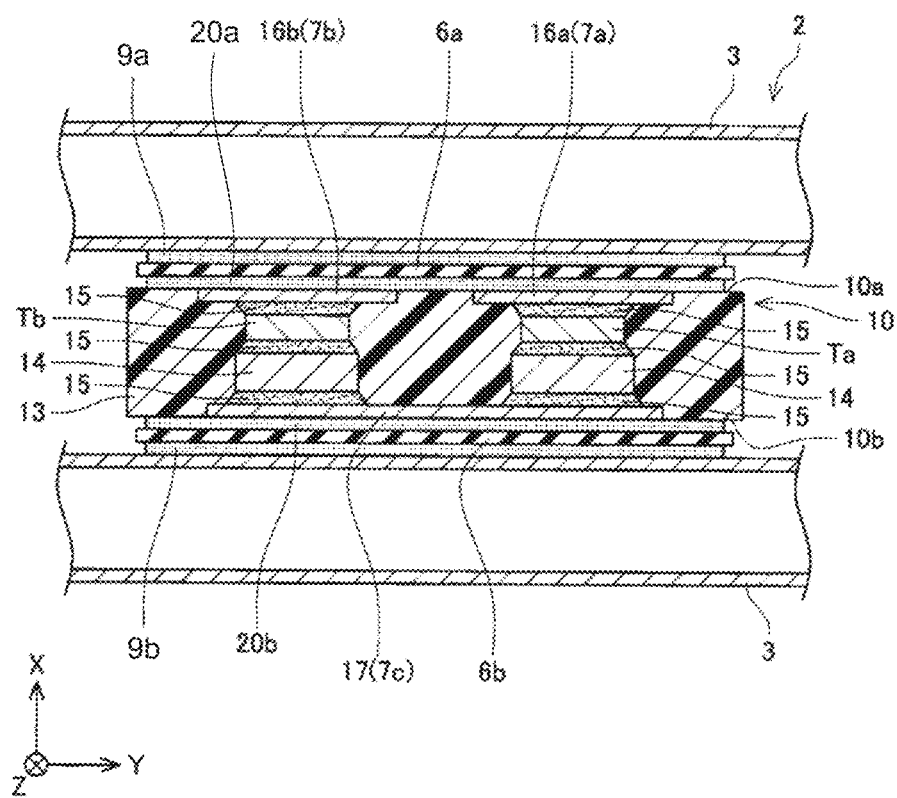
FIG. 3 is a schematic cross-sectional view of the power card 10 in FIG. 2 taken along a plane parallel to the XY-surface of a coordinate system in the drawing and the plane across transistors Ta and Tb.

A description will be given of the structure between the power card 10 and the cooler 3 with reference to FIG. 3. FIG. 3 is a cross-sectional view of the power card 10 of FIG. 2 taken along the plane parallel to the XY-surface of the coordinate system in the drawing and the plane across the transistors Ta and Tb.

First, the internal structure of the power card 10 will be described. The four semiconductor devices (transistors Ta and Tb, diodes Da and Db) are housed in a resin package 13. The package 13 is formed by an injection molding and seals the semiconductor devices. In the following description, the flat surfaces 10a and 10b of the power card 10 are referred to as the flat surfaces 10a and 10b of the package 13 in some cases. In the embodiment illustrated in the drawing, the flat surfaces 10a and 10b have parts including metallic heat dissipation plates and resin package parts, and the self-assembled monolayers are formed on the whole region of the flat surfaces 10a and 10b including these parts.

The semiconductor devices are each flat chip. The chip of the transistor Ta (Tb) has one flat surface on which a collector electrode is exposed and the other flat surface on which an emitter electrode is exposed. The electrode on the one flat surface of the transistor Ta is joined to a back surface of the heat dissipation plate 16a with solder 15. The heat dissipation plate 16a has a front surface exposed on the flat surface 10a of the package 13. The electrode on the other flat surface of the transistor Ta is joined to a back surface of the heat dissipation plate 17 via a conductive spacer 14 with the solder 15. The heat dissipation plate 17 has a front surface exposed on the flat surface 10b of the package 13. The transistor Ta (Tb) includes a gate electrode disposed at the end of the one flat surface of the chip. Similarly to the transistor Ta, the transistor Tb includes respective electrodes joined to the heat dissipation plate 16b and the heat dissipation plate 17 using the solder 15 and the spacer 14.

The heat dissipation plate 16a is a part of the electrode terminal 7a. The electrode terminal 7a, which couples the electrode of the transistor Ta to an external other device, has a part exposed on the flat surface 10a of the package 13, and the part corresponds to the heat dissipation plate 16a. Since the electrode terminal 7a is in contact with the electrode of the transistor Ta, the electrode terminal 7a easily transmits the heat inside the transistor Ta. Meanwhile, since the cooler 3 is made of aluminum (conductive metal), the cooler 3 requires to be insulated from the heat dissipation plate 16a. Therefore, the semiconductor apparatus 2 includes the insulating plate 6a sandwiched between the cooler 3 and the heat dissipation plate 16a (power card 10). The insulating plates 6a and 6b are made of thin, highly insulating, and highly heat conductive ceramic. The heat dissipation plate 16a (electrode terminal 7a) and the spacer 14 are made of highly conductive and highly heat conductive copper. The same applies to the heat dissipation plate 16b and the heat dissipation plate 17.

Similarly to the heat dissipation plate 16a, the heat dissipation plates 16b and 17 are parts of the electrode terminals 7b and 7c, respectively. Similarly to the transistors Ta and Tb, the diodes Da and Db are flat chips. The electrodes exposed on the flat surfaces of the diodes Da and Db are coupled to the heat dissipation plates 16a, 16b, and 17, similarly to the transistors Ta and Tb.

As illustrated in FIG. 3, the self-assembled monolayer (not illustrated) is formed on the flat surface 10a of the power card 10, and the grease 20a is applied over the self-assembled monolayer. The grease 20a is applied over the whole of the front surfaces of the heat dissipation plate 16a and the heat dissipation plate 16b, and applied between the flat surface 10a of the package 13 and the insulating plate 6a. Similarly, the self-assembled monolayer is formed on the flat surface 10b of the power card 10, and the grease 20b is applied over the self-assembled monolayer. That is, the grease 20b similar to the grease 20a is also applied between the heat dissipation plate 17 and the insulating plate 6b.

The grease 9a is applied between the insulating plate 6a and the cooler 3. Similarly, the grease 9b is also applied between the insulating plate 6b and the cooler 3. The insulating plates 6a and 6b are made of, for example, silicon nitride ($Si_3N_4$) or aluminum nitride (AlN).

The semiconductor apparatus 2 is applicable to an inverter of a drive system in an electric vehicle (for example, hybrid vehicle).

EXAMPLES

The following describes some examples relating to this embodiment, while this embodiment is not limited by the examples.

Example 1

As apparatuses to measure heat conductivity, a first measuring tool 51 and a second measuring tool 52 were prepared. The first measuring tool 51 includes a cooling portion 51*a* as a portion cooled in the measurement of the heat conductivity and a first columnar portion 51*b*. The first measuring tool 51 is made of aluminum. The second measuring tool 52 includes a heating portion 52*a* as a portion heated in the measurement of the heat conductivity and a second columnar portion 52*b*. The second measuring tool 52 is made of aluminum. The first columnar portion 51*b* and the second columnar portion 52*b* have a plurality of measuring holes (not illustrated) to dispose a thermocouple along a thickness direction.

Figure 4:
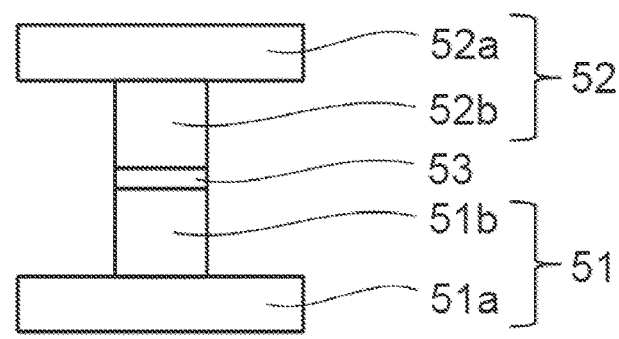
FIG. 4 is a schematic cross-sectional view illustrating a configuration where heat resistance is measured in Example or Comparative Example.

3-glycidyloxypropyltrimethoxysilane (GOPTS) was used as the SAM-forming material, and the SAM was formed on a top surface of the first columnar portion 51*b* of the first measuring tool 51 (made of aluminum) illustrated in FIG. 4 in the following order. The structural formula of GOPTS is indicated below.

[Chem. 1]

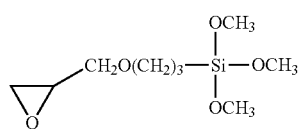

First, ultrasonic cleaning with acetone was performed on the top surface of the first columnar portion 51*b* for 10 minutes, subsequently the ultrasonic cleaning with ethanol was performed for 10 minutes, and further, the ultrasonic cleaning with ultrapure water was performed for 10 minutes.

Next, the top surface of the first columnar portion 51*b* was irradiated with the vacuum ultraviolet light (VUV) emitted from an excimer lamp for 20 minutes at room temperature under atmospheric pressure. With such VUV irradiation, the top surface was cleaned and an OH group was introduced to the top surface.

The first measuring tool 51 treated through the VUV irradiation was housed in a Teflon (registered trademark) type reaction vessel, introduced in an electric furnace, and heated at 150° C. for 10 minutes. Thus, adsorbed water of the reaction vessel and the first measuring tool 51 was removed.

The first measuring tool 51 and the reaction vessel on which such heat treatment had been performed were moved to a glove box where humidity was kept to 7 to 12% (relative humidity at 25° C.). In the glove box, the first measuring tool 51 was fixed such that the first measuring tool 51 was disposed on a substrate holder disposed on the bottom portion of the reaction vessel while the first measuring tool 51 had the top surface upward. With the first measuring tool 51, the SAM-forming material (GOPTS) put in a glass container was disposed in the reaction vessel. That is, the first measuring tool 51 and the SAM-forming material were housed in the reaction vessel, and the reaction vessel was sealed.

The sealed reaction vessel was held in the electric furnace at 150° C. for three hours, the GOPTS was chemically vapor deposited on the top surface of the first columnar portion 51*b*, and the SAM was formed on the top surface. Afterwards, the reaction vessel was took out from the electric furnace and cooled. The above-described method provided the first measuring tool 51 where the SAM derived from the GOPTS was formed on the surface. With the measurement, the SAM surface had a water contact angle of about 80°.

Next, the heat dissipation grease (manufactured by Shin-Etsu Chemical Co., Ltd., product name: X-23-7865-150) was applied over the top surface of the second columnar portion 52*b* of the second measuring tool 52. Next, the top surface of the first columnar portion 51*b* where the SAM was formed and the top surface of the second columnar portion 52*b* where the heat dissipation grease was applied were joined as illustrated in FIG. 4, and a predetermined pressure was applied between the first measuring tool 51 and the second measuring tool 52. In FIG. 4, reference numeral 53 denotes the heat dissipation grease. In FIG. 4, the SAM is not illustrated.

Figure 5:
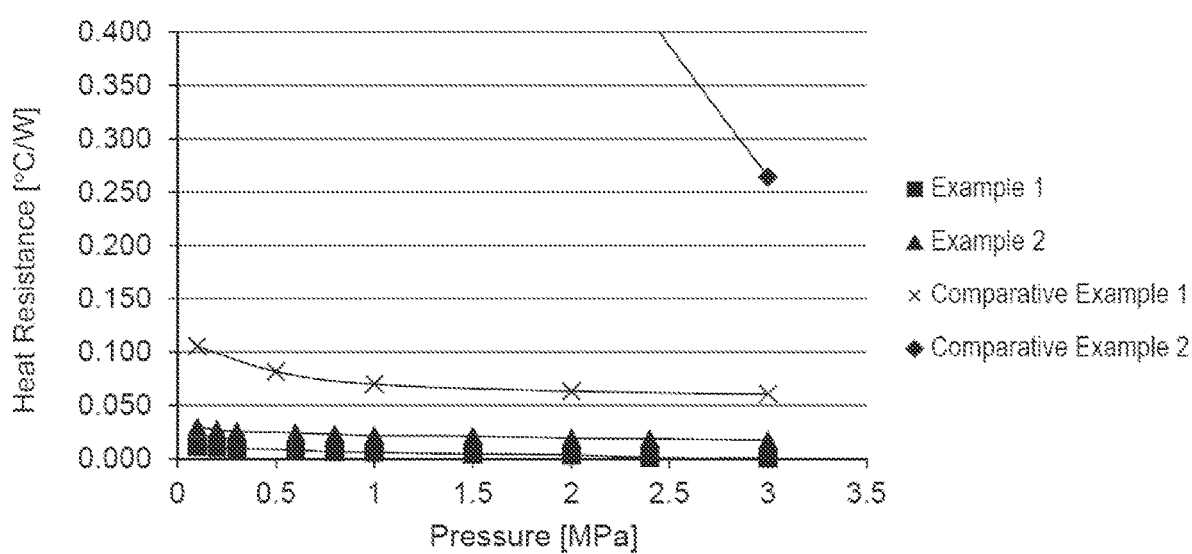
FIG. 5 is a graph indicating measurement results of the heat resistance in Examples 1 and 2 and Comparative Examples 1 and 2.

Next, the cooling portion 51*a* was kept at a constant temperature, and the heating portion 52*a* was heated, thus causing a constant temperature difference in the thickness direction of the measuring tools. Transmitted heat flow rate was obtained from the temperature gradient, and heat resistance [° C./W] was calculated from this heat flow rate. The result is indicated in FIG. 5. In the graph of FIG. 5, the horizontal axis indicates the pressure [MPa] and the vertical axis indicates the heat resistance [° C./W].

Example 2

The heat resistance [° C./W] was measured in the same manner as in Example 1 except that the irradiation time of the vacuum ultraviolet light (VUV) was 180 minutes instead of 20 minutes. The result is indicated in FIG. 5.

Comparative Example 1

The heat resistance [° C./W] was measured in the same manner as in Example 1 except that the first measuring tool 51 without the SAM was used. That is, in Comparative Example 1, the heat dissipation grease is disposed between the top surfaces of both measuring tools and the SAM is not formed. The result is indicated in FIG. 5.

Comparative Example 2

The heat resistance [° C./W] was measured in the same manner as in Example 1 except that the first measuring tool 51 without the SAM was used and the heat dissipation grease was not applied. That is, in Comparative Example 2, nothing is disposed between the top surfaces of both measuring tools, and those top surfaces are directly in contact. The result is indicated in FIG. 5.

Comparative Example 3

Figure 6:
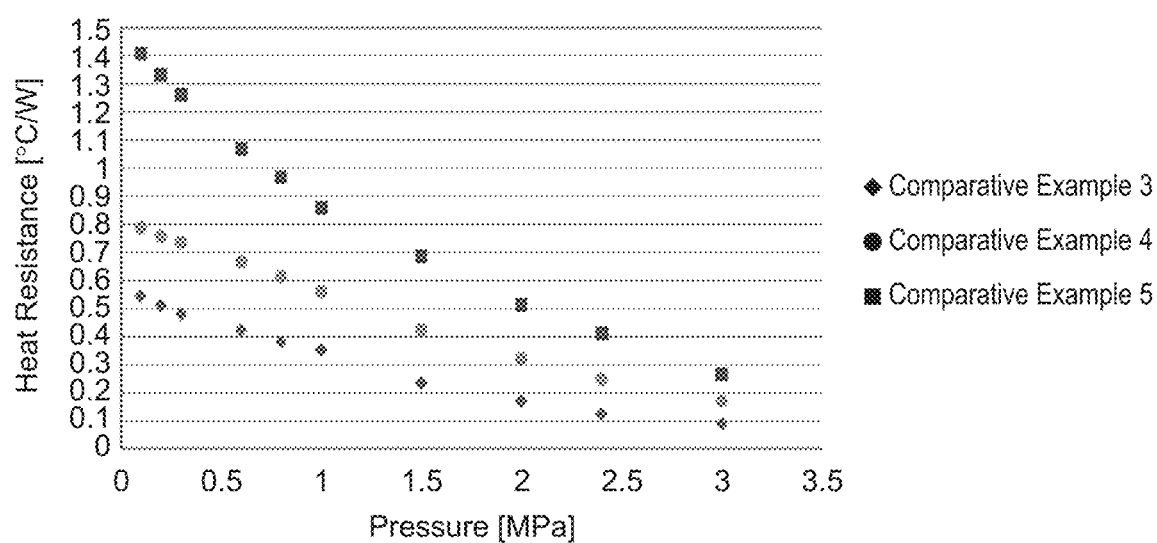
FIG. 6 is a graph indicating measurement results of the heat resistance in Comparative Examples 3 to 5.

The SAM derived from octadecyltrimethoxysilane (ODS) was formed on the top surface of the first measuring tool 51 with the method similar to that of Example 1. The heat resistance [° C./W] was measured in the same manner as in Example 1 except that the first measuring tool 51 with the SAM derived from the ODS was used and the heat dissipation grease was not applied. That is, in Comparative Example 3, the SAM derived from the ODS is formed on the top surface of the first measuring tool 51 and the SAM is in contact with the top surface of the second measuring tool 52. The result is indicated in FIG. 6.

Comparative Example 4

The SAMs derived from octadecyltrimethoxysilane (ODS) was formed on the top surface of the first measuring tool 51 and the top surface of the second measuring tool 52 with the method similar to that of Example 1. The heat resistance [° C./W] was measured in the same manner as in Example 1 except that the first measuring tool 51 and the second measuring tool 52 with the SAMs derived from the ODS were used and the heat dissipation grease was not applied. That is, in Comparative Example 4, the SAMs are formed on the top surfaces of both measuring tools, and both SAMs are directly in contact. The result is indicated in FIG. 6.

Comparative Example 5

The heat resistance [° C./W] was measured in the same manner as in Example 1 except that the first measuring tool 51 without the SAM was used and the heat dissipation grease was not applied. That is, in Comparative Example 5, nothing is disposed between the top surfaces of both measuring tools, and those top surfaces are directly in contact. Comparative Example 5 corresponds to Comparative Example 2. The result is indicated in FIG. 6.

The results indicated in FIGS. 5 and 6 show that the configuration of the heat conduction structure according to this embodiment decreases the heat resistance. That is, it is understood that the heat conduction structure according to this embodiment has the higher heat conductivity.

While the embodiments have been described in detail, the specific configuration is not limited to the embodiments. Design changes within a scope not departing from the gist of the disclosure are included in the disclosure.

DESCRIPTION OF SYMBOLS

2 Semiconductor apparatus
3 Cooler
4a Refrigerant supply pipe
4b Refrigerant discharge pipe
5a, 5b Coupling pipe
6a, 6b Insulating plate
7a, 7b, 7c Electrode terminal
9a, 9b Grease
10 Power card
10a, 10b Flat surface
13 Package
14 Spacer
15 Solder
16a, 16b, 17 Heat dissipation plate
20a, 20b Grease
29 Control terminal
31 Case
32 Leaf spring
Da, Db Diode
Ta, Tb Transistor
51 First measuring tool
51a Cooling portion
51b First columnar portion
52 Second measuring tool
52a Heating portion
52b Second columnar portion
53 Heat dissipation grease
101 First member
102 Second member
103a First self-assembled monolayer
103b Second self-assembled monolayer
104 Heat dissipation grease

What is claimed is:

1. A heat conduction structure where heat is conducted from a first member to a second member, comprising:
at least one self-assembled SAM formed on at least one surface of the first member and the second member; and
a heat dissipation grease disposed between the first member and the second member, the heat dissipation grease being in contact with the at least one SAM, wherein the at least one SAM is formed of a SAM-forming material that has a head group, and the head group forms a covalent bond with a functional group that exists on the surface of the first member or the second member.

2. The heat conduction structure according to claim 1, wherein the SAM-forming material has a tail group in addition to the head group, and the tail group has hydrophobicity.

3. The heat conduction structure according to claim 2, wherein the at least one SAM has a water contact angle of 70° or more.

4. The heat conduction structure according to claim 1, wherein the SAM-forming material is an organic silane compound.

5. The heat conduction structure according to claim 1, wherein the heat dissipation grease contains a mineral oil, an ester-based synthetic oil, a synthetic hydrocarbon oil, a silicone oil, or a fluorinated oil as a base oil.

6. The heat conduction structure according to claim 1, wherein the first member is a heat generating member, and the second member is a heat dissipation member.

7. A semiconductor apparatus that includes the heat conduction structure according to claim 1,
wherein the first member is a semiconductor module.

8. The heat conduction structure according to claim 1, wherein the at least one SAM is formed on a surface of the first member and a surface of the second member.

9. The heat conduction structure according to claim 1, wherein the at least one SAM is formed on a surface of the first member and on a surface of the second member, and the surface of the first member faces the surface of the second member.

* * * * *